US009722829B2

(12) United States Patent
Lee et al.

(10) Patent No.: US 9,722,829 B2
(45) Date of Patent: Aug. 1, 2017

(54) PULSE SHAPING CIRCUIT FOR IMPROVING SPECTRUM EFFICIENCY AND ON-OFF KEYING (OOK) TRANSMITTER INCLUDING PULSE SHAPING CIRCUIT

(71) Applicants: SAMSUNG ELECTRONICS CO., LTD., Suwon-si (KR); POSTECH ACADEMY-INDUSTRY FOUNDATION, Pohang-si (KR)

(72) Inventors: Jae Sup Lee, Yongin-si (KR); Bum Man Kim, Pohang-si (KR); Han-Kyu Lee, Pohang-si (KR); Dae Chul Jeong, Pohang-si (KR); Tae Young Chung, Pohang-si (KR)

(73) Assignees: Samsung Electronics Co., Ltd., Suwon-si (KR); Postech Academy-Industry Foundation, Pohang-si (KR)

( * ) Notice: Subject to any disclaimer, the term of this patent is extended or adjusted under 35 U.S.C. 154(b) by 0 days.

(21) Appl. No.: 14/190,498

(22) Filed: Feb. 26, 2014

(65) Prior Publication Data
US 2015/0139362 A1 May 21, 2015

(30) Foreign Application Priority Data
Nov. 19, 2013 (KR) .......................... 10-2013-0140976

(51) Int. Cl.
| H03C 1/52 | (2006.01) |
| H04L 27/04 | (2006.01) |
| H03F 1/02 | (2006.01) |
| H03F 3/217 | (2006.01) |
| H03F 3/24 | (2006.01) |

(Continued)

(52) U.S. Cl.
CPC ............ *H04L 27/04* (2013.01); *H03F 1/0277* (2013.01); *H03F 3/2171* (2013.01); *H03F 3/245* (2013.01); *H03F 3/72* (2013.01); *H04L 25/03834* (2013.01); *H03F 2200/408* (2013.01)

(58) Field of Classification Search
CPC . H04L 27/04; H04L 25/03834; H03F 1/0277; H03F 2200/408; H03F 3/2171; H03F 3/245; H03F 3/72
USPC ........................................................ 375/300
See application file for complete search history.

(56) References Cited

U.S. PATENT DOCUMENTS 5,656,960 A * 8/1997 Holzer .......................... 327/170
5,696,794 A 12/1997 O'Dea
5,880,633 A 3/1999 Leizerovich et al.
(Continued)

FOREIGN PATENT DOCUMENTS

| KR | 10-0875201 B1 | 12/2008 |
| KR | 10-1013461 B1 | 2/2011 |
| KR | 10-1094088 B1 | 12/2011 |

OTHER PUBLICATIONS

Huang, X. ; Harpe, P. ; Xiaoyan Wang ; Dolmans, G. ; de Groot, H.: "A 0dBm 10Mbps 2.4GHz ultra-low power ASK/OOK transmitter with digital pulse-shaping", 2010 IEEE Radio Frequency Integrated Circuits Symposium (RFIC), pp. 263-266.*
Vidojkovic, M.; Huang, X.; Harpe, P.; Rampu, S.; Zhou, C.; Li Huang; Imamura, K.; Busze, B.; Bouwens, F.; Konijnenburg, M.; Santana, J.; Breeschoten, A.; Huisken, J.; Dolmans, G.; de Groot, H. "A 2.4GHz ULP OOK single-chip transceiver for healthcare applications", 2011 IEEE International Solid-State Circuits Conference Digest of Technical Papers (I.*

(Continued)

*Primary Examiner* — Nader Bolourchi
(74) *Attorney, Agent, or Firm* — NSIP Law

(57) ABSTRACT

A pulse shaping circuit is configured to shape a waveform of an edge of a signal applied to a switch of a power amplifier included in an on-off keying transmitter.

8 Claims, 5 Drawing Sheets

(51) Int. Cl.
*H03F 3/72* (2006.01)
*H04L 25/03* (2006.01)

(56) References Cited

U.S. PATENT DOCUMENTS

| | | |
|---|---|---|
| 6,094,458 A | 7/2000 | Hellberg |
| 8,183,917 B2 | 5/2012 | Drogi et al. |
| 2007/0222486 A1 | 9/2007 | Koch, II et al. |
| 2007/0223700 A1* | 9/2007 | Lee et al. .................. 380/263 |
| 2007/0230701 A1* | 10/2007 | Park et al. ................ 380/263 |
| 2009/0039972 A1 | 2/2009 | Mahooti |

OTHER PUBLICATIONS

Seong Joong Kim; Kim, Bumman; Sangwook Nam; Markovic, D.; Sang-Gug Lee; Jaesup Lee "Challenges and directions of ultra low energy wireless sensor nodes for biosignal monitoring", 2012 IEEE International Symposium onCircuits and Systems (ISCAS), pp. 986-989.*

Vidojkovic et. al; "A 2.4 GHz ULP OOK Single-Chip Transceiver for Healthcare Applications", IEEE Transactions on Biomedical Circuits and Systems, pp. 523-534 vol. 5, Issue: 6, Dec. 2011.*

Kim et al. "Design of a 3.5-GHz OOK CMOS transmitter with triangular pulse shaping." SoC Design Conference (ISOCC), 2009 International. IEEE, (2009):104-107.

* cited by examiner

PULSE SHAPING CIRCUIT FOR IMPROVING SPECTRUM EFFICIENCY AND ON-OFF KEYING (OOK) TRANSMITTER INCLUDING PULSE SHAPING CIRCUIT

CROSS-REFERENCE TO RELATED APPLICATION

This application claims the benefit under 35 USC 119(a) of Korean Patent Application No. 10-2013-0140976, filed on Nov. 19, 2013, in the Korean Intellectual Property Office, the entire disclosure of which is incorporated herein by reference for all purposes.

BACKGROUND

1. Field

The following description relates to a pulse shaping circuit for improving spectrum efficiency, and an on-off-keying (OOK) transmitter including the pulse shaping circuit.

2. Description of Related Art

Spectrum bands that may be used in a low power wireless sensor network communication system are limited, and a number of available channels may be increased according to a decrease in a size of a bandwidth occupied by each channel. An on-off keying (OOK) modulation method may be used to improve power efficiency of the low power wireless sensor network communication system. However, in the OOK modulation method, spectrum efficiency may be relatively low despite high power efficiency. When an output waveform is shaped to improve the spectrum efficiency, the power efficiency may be decreased. In the OOK modulation method, the power efficiency and the spectrum efficiency may be in a trade-off relationship.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a pulse shaping circuit configured to shape a waveform of an edge of a signal applied to a switch of a power amplifier included in an on-off keying transmitter.

The pulse shaping circuit may be configured to moderate a slope of a falling edge and a slope of a rising edge of the signal in a right direction.

The pulse shaping circuit may be configured to moderate a slope of a falling edge and a slope of a rising edge of the signal in a transition time of the signal.

The pulse shaping circuit may be configured to moderate a slope of a falling edge and a slope of a rising edge of the signal to smooth a waveform of an output signal of the power amplifier and to delay a period of time during which a state of the power amplifier reaches a saturation region.

The pulse shaping circuit may include a first inverter and a second inverter that are connected in series, and a capacitor connected to an output end of the second inverter. The signal may be output through the capacitor.

The switch may be disposed at a source end of the power amplifier, and may include a transistor.

In another general aspect, there is provided an on-off keying (OOK) transmitter including a phase lock loop circuit, a buffer, a power amplifier including a switch, and a pulse shaping circuit configured to shape a waveform of an edge of a signal applied to the switch.

In still another general aspect, there is provided a transmitter including a power amplifier including a switch, and a pulse shaping circuit configured to shape a waveform of a signal applied to the switch.

The pulse shaping circuit may be configured to decrease a slope of a rising edge and a slope of a falling edge of the signal during a pulse of the signal.

The pulse shaping circuit may include a first inverter and a second inverter that are connected in series, and a capacitor connected to an output end of the second inverter.

The switch may be disposed at a source of the power amplifier.

The switch may include a transistor, and the signal may be applied to a gate of the transistor.

Other features and aspects will be apparent from the following detailed description, the drawings, and the claims.

Figure 1:
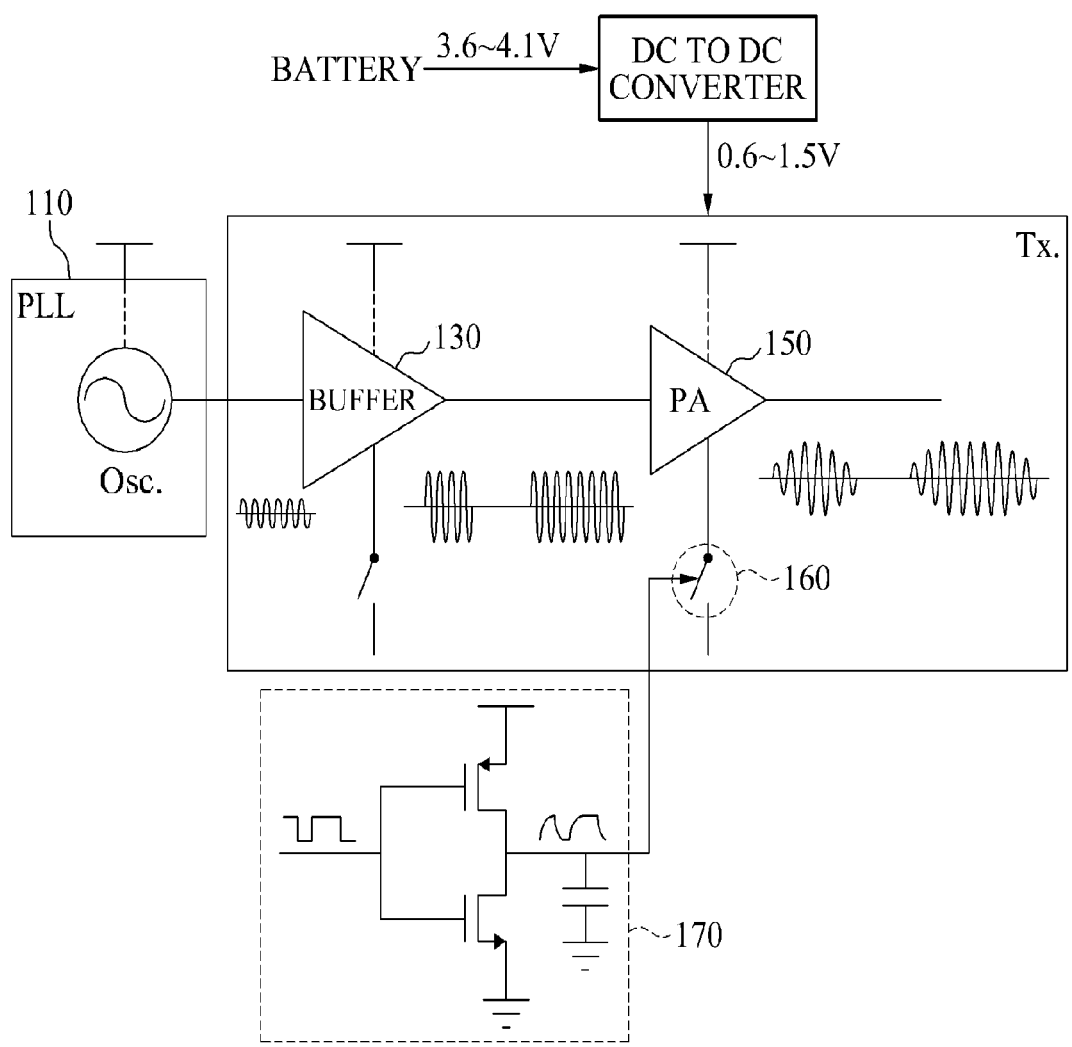
FIG. 1 is a diagram illustrating an example of an on-off keying (OOK) transmitter.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a diagram illustrating an example of an on-off keying (OOK) transmitter (Tx.). Referring to FIG. 1, the OOK transmitter includes a phase locked loop (PLL) circuit 110, a buffer 130, a power amplifier 150, a switch 160, and a pulse shaping circuit 170. The PLL circuit 110 includes an oscillator (Osc.).

In general, operations of the PLL circuit 110, the buffer 130, and the power amplifier 150 included in the OOK transmitter may be understood from operations of corresponding elements included in a known OOK transmitter, and thus, descriptions related to the operations thereof will be omitted for increased clarity and conciseness.

The switch 160 is disposed at a source end of the power amplifier 150, and may include a transistor, for example, a metal-oxide-semiconductor field-effect transistor (MOSFET).

The pulse shaping circuit 170 shapes a waveform of an edge of a signal applied to the switch 160 of the power amplifier 150. Descriptions about a configuration of the pulse shaping circuit 170 and a shape of the waveform shaped by the pulse shaping circuit 170 will be provided with reference to FIGS. 3 and 4.

The pulse shaping circuit 170 includes a first inverter and a second inverter, which are connected in series, and a single capacitor connected to an output end of the second inverter. The capacitor outputs the signal applied to the switch 160 of the power amplifier 150. The second inverter and the capacitor are included in the pulse shaping circuit 170 in order to represent a connective relationship between an inverter and a capacitor.

The OOK transmitter may further include a battery and a direct current (DC) to DC converter. The battery outputs an DC voltage of, e.g., about 3.6-4.1 volts (V), and the DC to DC converter converts the DC voltage output by the battery to another DC voltage of, e.g., about 0.6-1.5 V, which may be used to power the OOK transmitter, e.g., the PLL 110, the buffer 130, the PA 150, and the pulse shaping circuit 170.

Figure 2:
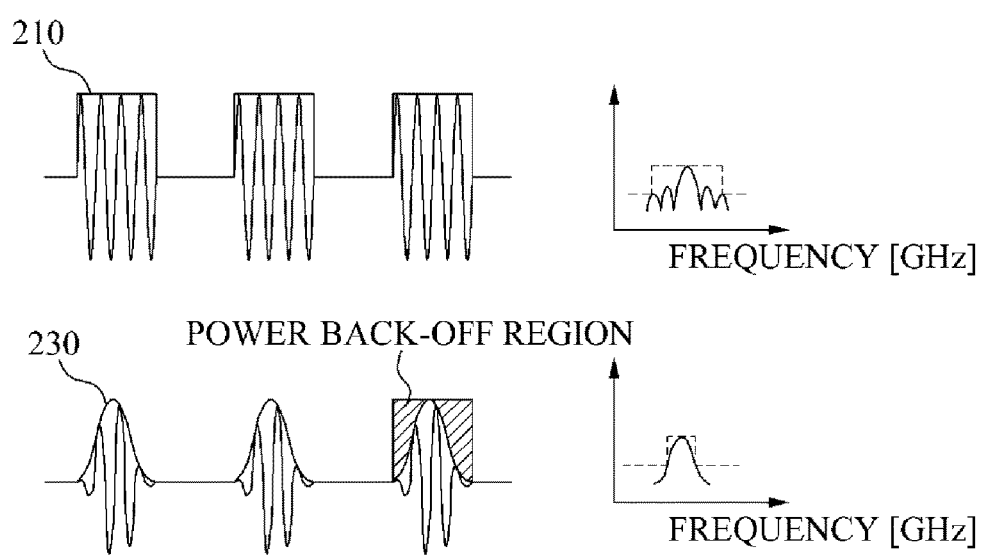
FIG. 2 is a diagram illustrating an example of a change in a spectrum based on an output waveform of the OOK transmitter of FIG. 1.

FIG. 2 is a diagram illustrating an example of a change in a spectrum based on an output waveform of the OOK transmitter of FIG. 1. In the OOK transmitter, an amplifier operating when an output signal reaches a peak power as indicated by a rectangular wave 210 may achieve an average efficiency similar to an efficiency of a saturation region, and thus, may achieve the average efficiency greater than that of a shaped circuit. In addition, in the OOK transmitter, according to an increase in a length of an interval in which the output signal of the amplifier operates in a power back-off region 230, the average efficiency of the amplifier may be reduced.

When a waveform of the output signal of the amplifier is shaped as the rectangular wave 210, a size of bandwidth is reduced based on a shaped form. However, in this example, the amplifier included in the OOK transmitter may need to operate in the back-off region 230, in lieu of the saturation region, to shape the waveform, and thus, an operation may be performed during the interval in which the average efficiency of the amplifier is relatively low.

Figure 3:
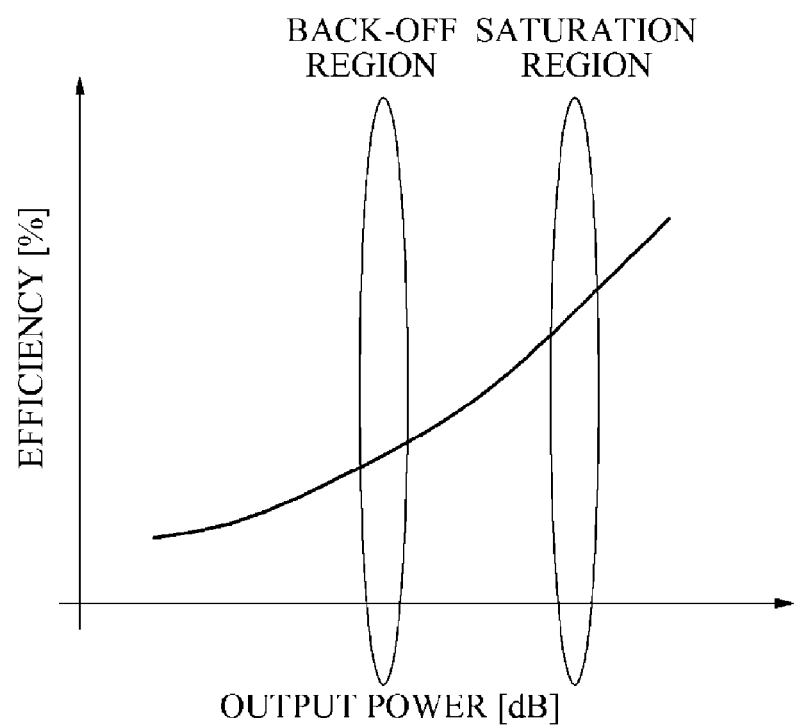
FIG. 3 is a graph illustrating an example of a relationship between an output power and an efficiency of an amplifier in the OOK transmitter of FIG. 1.

FIG. 3 is a graph illustrating an example of a relationship between an output power and an efficiency of an amplifier in the OOK transmitter of FIG. 1. In order to shape a waveform, an amplifier may need to operate in a back-off region having a low output power, by passing through a saturation region in which an output power is maximized.

In an example, reduction in power efficiency resulting from an increase in spectrum efficiency may be minimized using limited frequency resources of an ultra low power (ULP) wireless sensor network communication system. Thus, the OOK transmitter may increase a number of channels by reducing a size of a frequency bandwidth occupied by a single channel as described in FIG. 3.

Referring to FIG. 3, most signals of the OOK transmitter may operate at a maximum power to reduce a length of an interval in which the power efficiency is decreased. Also, an edge of a signal applied to the power amplifier may be shaped using a pulse shaping circuit, thereby minimizing reduction in the power efficiency.

Figure 4:
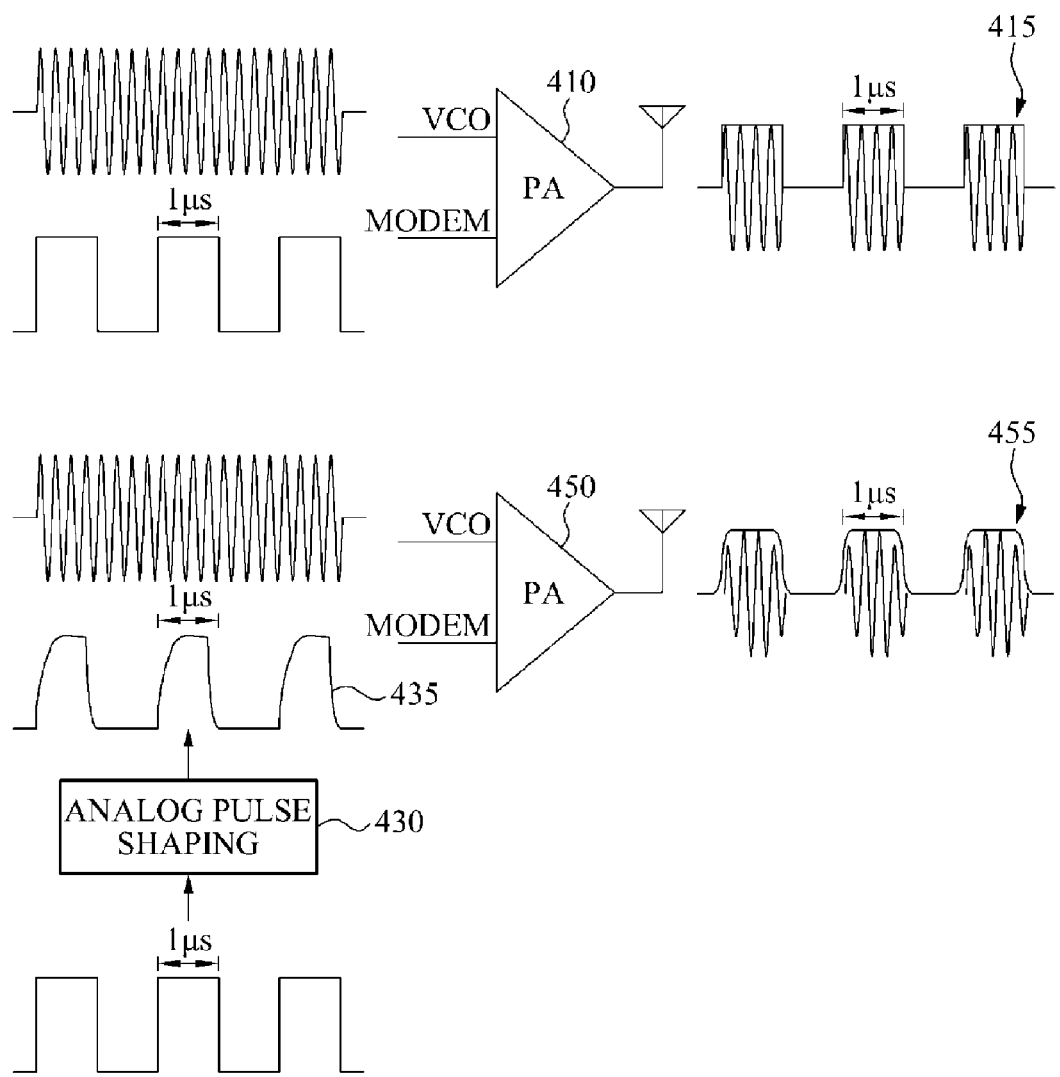
FIG. 4 is a diagram illustrating an example of a shaped signal applied to a power amplifier by a pulse shaping circuit.

FIG. 4 is a diagram illustrating an example of a shaped signal to be applied to a power amplifier by a pulse shaping circuit. Referring to FIG. 4, a waveform 415 of a signal output from a power amplifier 410 included in a conventional OOK transmitter differs from a waveform 455 of a signal output from a power amplifier 450 to which a signal shaped by a pulse shaping circuit 430 (analog pulse shaping) is input.

In detail, a rectangular wave of which a slope of a rising edge and a slope of a falling edge are 90 degrees (°) may be applied to the power amplifier 410 included in the conventional OOK transmitter. Thus, the output waveform of the power amplifier 410 may be generated as indicated by the waveform 415.

A signal 435 shaped by the pulse shaping circuit 430 may be input to a switch disposed at a source end of the power amplifier 450. The pulse shaping circuit 430 may shape a waveform of a signal input to the pulse shaping circuit 430 such that a slope of a rising edge and a slope of a falling edge may be moderated in a right direction as indicated by a waveform of the signal 435. The pulse shaping circuit 430 may moderate the slopes of the rising edge and the falling edge of the signal in or during a transition time (e.g., 1 microsecond (μs)) or pulse of the signal 435 applied to the switch disposed at the source end of the power amplifier 450. When the slopes of the rising edge and the falling edge are moderated, the pulse shaping circuit 430 may delay a time at which an operational area of the power amplifier 450 reaches a saturation region, thereby smoothing a rising edge and a falling edge of the waveform 455 of the output signal of the power amplifier 450 in or during a transition time (e.g., 1 μs) or pulse of the output signal.

As described above, when a spectrum efficiency is increased, a power efficiency may be reduced. In this example, high efficiency may be maintained on average by shaping an edge of the waveform of the signal 435 applied to the power amplifier 450.

When the signal 435 applied to the switch of the power amplifier 450 corresponds to "1", the output waveform 455 of the power amplifier 450 may be "1". When the signal 435 applied to the switch of the power amplifier 450 corresponds to "0", the output waveform 455 of the power amplifier 450 may be absent. When the output waveform 455 is absent, the signal may be "0".

Figure 5:
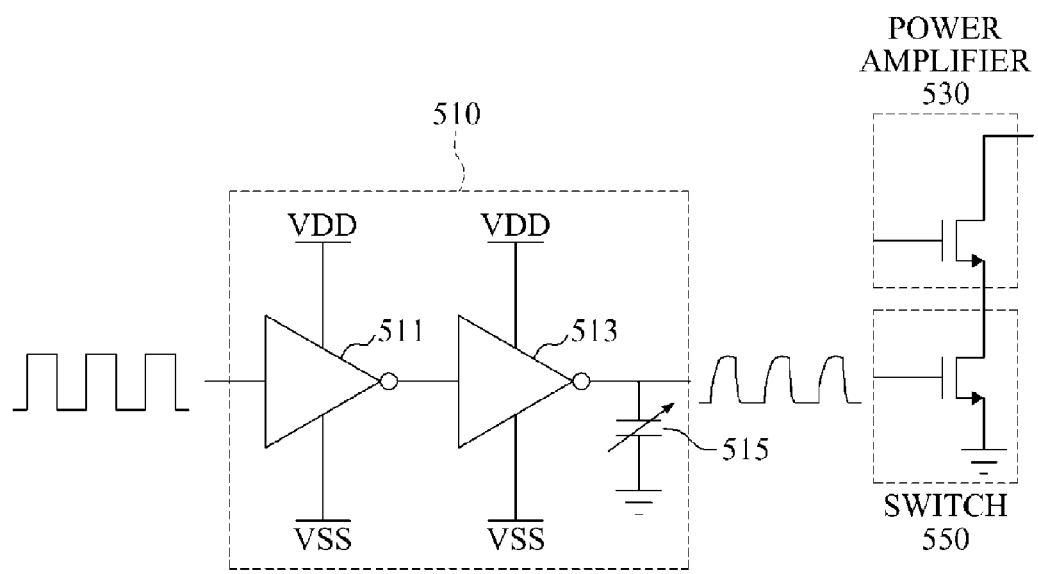
FIG. 5 is a diagram illustrating an example of a pulse shaping circuit, and a connective relationship between the pulse shaping circuit and a power amplifier of an OOK transmitter.

FIG. 5 is a diagram illustrating an example of a pulse shaping circuit 510, and a connective relationship between the pulse shaping circuit 510 and a power amplifier 530 of an OOK transmitter. Referring to FIG. 5, the pulse shaping circuit 510 includes a first inverter 511 and a second inverter 513, which are connected in series, and a single capacitor 515.

An output end of the first inverter 511 is connected to an output end of the second inverter 513, and the output end of the second inverter 513 is connected to the capacitor 515. The pulse shaping circuit 510 uses the first inverter 511, the second inverter, and the capacitor 515, to filter a high frequency component and shape a waveform using a low power, for example, a power of 5 microwatts (μW) or a power less than 3 μW.

A signal output through the capacitor 515 is applied to a switch 550 of the power amplifier 530. The switch 550 is disposed at a source end of the power amplifier 530, and may include a transistor.

The pulse shaping circuit 510 may shape the waveform of an edge of the signal applied by a voltage supplied between a source terminal and a gate terminal of the transistor included in the switch 550. The pulse shaping circuit 510 may shape the waveform such that a slope of a rising edge and a slope of a falling edge of the signal applied to the switch 550 may be moderated in a right direction. The pulse shaping circuit 510 may shape the waveform such that the slopes of the rising edge and the falling edge of the signal may be moderated in a transition time of the signal applied to the switch 550.

The various elements and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, Compact Discs (CDs) including: Compact Disc Read-Only Memory (CD-ROMs), Recordable CD (CD-Rs, CD+Rs), and Rewritable CD (CD-RWs, CD+RWs); Digital Versatile Discs (DVDs) including: Digital Versatile Disc Read-Only Memory (DVD-ROMs), Recordable DVD (DVD-Rs, DVD+Rs), Rewritable DVD (DVD-RWs, DVD+RWs), and DVD Random Access Memory (DVD-RAMs); Blu-ray Discs (BDs) including: Blu-ray Disc Read Only Memory (BD-ROMs), Blu-ray Disc Recordable (BD-Rs), Blu-ray Disc Recordable Low To High (BD-R LTHs), Blu-ray Disc Recordable and Erasable (BD-REs); magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A pulse shaping circuit configured to shape a waveform of an edge of a signal applied to a switch of a power amplifier comprised in an on-off keying transmitter
wherein the pulse shaping circuit consists of:
a first inverter and a second inverter that are connected in series; and
a capacitor connected to an output end of the second inverter,
wherein the signal is output through the capacitor and disposed at a gate end of a transistor in the switch,
wherein the signal output through the capacitor is applied to the switch of the power amplifier, and
wherein the pulse shaping circuit is configured to moderate a slope a falling edge and a slope of a rising edge of the signal in a transition time of the signal.

2. The pulse shaping circuit of claim 1, wherein the pulse shaping circuit is configured to moderate a slope of a falling edge and a slope of a rising edge of the signal in a right direction.

3. The pulse shaping circuit of claim 1, wherein the pulse shaping circuit is configured to moderate a slope of a falling edge and a slope of a rising edge of the signal to smooth a waveform of an output signal of the power amplifier and to delay a period of time during which a state of the power amplifier reaches a saturation region.

4. An on-off keying (OOK) transmitter, comprising:
a phase lock loop circuit;
a buffer;
a power amplifier;
a switch disposed at a source end of the power amplifier and including a transistor; and
a pulse shaping circuit configured to shape a waveform of an edge of a signal applied to the switch,
wherein an output waveform of the power amplifier is determined based on a signal applied to the switch,
wherein the pulse shaping circuit consists of:
a first inverter and a second inverter that are connected in series, and
a capacitor connected to an output end of the second inverter and disposed at a gate end of a transistor in the switch,
wherein a signal output through the capacitor is applied to the switch of the power amplifier, and
wherein the pulse shaping circuit is configured to moderate a slope a falling edge and a slope of a rising edge of the signal in a transition time of the signal.

5. The OOK transmitter of claim 4, wherein the pulse shaping circuit is configured to moderate a slope of a falling edge and a slope of a rising edge of the signal in a right direction.

6. The OOK transmitter of claim 4, wherein the pulse shaping circuit is configured to moderate a slope of a falling edge and a slope of a rising edge of the signal to smooth a waveform of an output signal of the power amplifier and to delay a period of time during which a state of the power amplifier reaches a saturation region.

7. A transmitter comprising:
a power amplifier;
a switch is disposed at a source end of the power amplifier and includes a transistor; and
a pulse shaping circuit configured to shape a waveform of a signal applied to the switch,
wherein a output waveform of the power amplifier is determined based on a signal applied to the switch,
wherein the pulse shaping circuit consists of:
a first inverter and a second inverter that are connected in series, and
a capacitor connected to an output end of the second inverter and disposed at a gate end of the transistor in a switch,
wherein the signal output through the capacitor is applied to the switch of the power amplifier, and
wherein the pulse shaping circuit is configured to moderate a slope a falling edge and a slope of a rising edge of the signal in a transition time of the signal.

8. The transmitter of claim 7, wherein the pulse shaping circuit is configured to decrease a slope of a rising edge and a slope of a falling edge of the signal during a pulse of the signal.

* * * * *